United States Patent
Lin

(10) Patent No.: US 8,653,862 B2
(45) Date of Patent: Feb. 18, 2014

(54) FREQUENCY DIVIDER WITH RETIMED CONTROL SIGNAL AND RELATED FREQUENCY DIVIDING METHOD

(75) Inventor: Ang-Sheng Lin, Kaohsiung (TW)

(73) Assignee: Mediatek Inc., Science-Based Industrial Park, Hsin-Chu (TW)

(*) Notice: Subject to any disclaimer, the term of this patent is extended or adjusted under 35 U.S.C. 154(b) by 183 days.

(21) Appl. No.: 13/158,482

(22) Filed: Jun. 13, 2011

(65) Prior Publication Data

US 2012/0313673 A1    Dec. 13, 2012

(51) Int. Cl.
*H03K 21/00* (2006.01)

(52) U.S. Cl.
USPC .............................. 327/115; 327/117; 377/47

(58) Field of Classification Search
USPC ............... 327/113–115, 117, 118; 377/47, 48
See application file for complete search history.

(56) References Cited

U.S. PATENT DOCUMENTS

| | | | |
|---|---|---|---|
| 6,542,013 B1 * | 4/2003 | Volk et al. ...................... 327/115 |
| 7,560,962 B2 * | 7/2009 | Kamath ......................... 327/158 |
| 7,741,886 B2 * | 6/2010 | Tsai ............................... 327/117 |
| 7,778,371 B2 * | 8/2010 | Do et al. ........................ 375/371 |
| 7,813,466 B2 * | 10/2010 | Huang et al. ..................... 377/47 |
| 7,994,828 B2 * | 8/2011 | Kao et al. ....................... 327/115 |
| 2006/0025094 A1 * | 2/2006 | Ozawa et al. .................. 455/208 |
| 2006/0245532 A1 | 11/2006 | Ziesler |

OTHER PUBLICATIONS

Benachour, "A 1.5GHz Sub-2mW CMOS Dual-Modulus Prescaler", Custom Integrated Circuits, 1999. Proceedings of the IEEE 1999, On pp. 613-616, May 1999.

* cited by examiner

*Primary Examiner* — Patrick O'Neill

(74) *Attorney, Agent, or Firm* — Winston Hsu; Scott Margo

(57) ABSTRACT

A frequency divider includes a phase selection circuit, control circuit and a retiming circuit. The phase selection circuit is arranged to receive a plurality of input signals with different phases, and generate an output signal by selectively outputting one of the input signals according to a plurality of retimed signals. The control circuit is arranged to receive the output signal to generate a plurality of control signals. The retiming circuit is arranged to retime the control signals to generate the retimed signals according to the input signals.

12 Claims, 11 Drawing Sheets

FREQUENCY DIVIDER WITH RETIMED CONTROL SIGNAL AND RELATED FREQUENCY DIVIDING METHOD

BACKGROUND OF THE INVENTION

1. Field of the Invention

The present invention relates to a frequency divider and a frequency dividing method, and more particularly, to a frequency divider and a frequency dividing method utilizing retimed control signals for phase selection.

2. Description of the Prior Art

As the progress of modern technology goes on, clock generating systems, e.g., a phase locked loop or a delay locked loop system, find a variety of applications in wireless communication systems. In order to minimize interfering impacts between crucial components within a system-on-chip (SOC) chip, signals with large power should be well-defined and separated from each other in frequency domain to obtain a better performance. As a result, fractional frequency dividers become significant building blocks within a wireless transmitter or receiver.

Conventional frequency dividers in low frequency range are usually implemented with dual-modulus or multi-modulus prescalers, for example, a divide-by-4.5 circuit can be realized by a prescaler of which the modulus equally distributed between 4 and 5. However, since those prescalers are required to change its modulus during outputting divided signals simultaneously, noise generated from modulus transition may also bring degradation to the outcome of the prescaler, leading to more undesired jitters.

Besides, dual-modulus or multi-modulus prescalers work in a digital fashion and both are not suitable to operate at high frequency. Some conventional high-speed frequency dividers utilize self-mixing mechanism to overcome speed issue at the expense of inductor area, whereas those inductors are necessary to filter out undesired signal among mixed results. Therefore, circuit designers seek a solution to derive a compact frequency dividing solution with less jitter noise and more efficiency.

In addition to the topologies introduced in the aforementioned paragraphs, phase selection is also another popular architecture to implement frequency dividing. Please refer to FIG. 1, which is a diagram of a conventional phase selection frequency divider 1000. The frequency divider 1000 includes a phase selection circuit 1100 and a control circuit 1200. The phase selection circuit 1100 receives a plurality of input signals, for example, four quadrature signals SI, SQ, SIB and SQB, to generate an output signal Sout by selectively outputting one of the input signals SI, SQ, SIB and SQB according to control information Sctrl. The control signal 1200 receives the output signal Sout to generate the control information Sctrl (in this example, the control information Sctrl should includes all the control signals for selecting one from all the input signals SI, SQ, SIB and SQB), wherein a period interval of the output signal Sout is composed of partial intervals selected from each of the input signals SI, SQ, SIB and SQB.

Please refer to FIG. 2 for operation details of the frequency divider 1000 shown in FIG. 1, FIG. 2 is an exemplary timing diagram of partial signals within the frequency divider 1000, the phase selection circuit 1100 choose to output one of the input signals SI, SQ, SIB and SQB to compose the frequency-divided output signal Sout with a dividing ratio 1.25 and a duty cycle of 40%. Please note that, when the phase selection circuit 1100 is switching from the input signal SI to the input signal SQ, the exact switching timing point should be limited from a time point ta to another time point tb, i.e., during a time interval Tc (a glitch-free window) when the input signal SI and the input signal SQ are both indicative of a low voltage level, therefore the control information Sctrl, after a series of gate delay, should make the phase selection circuit 1100 to perform phase selection during the time interval Tc, or else a glitch will occur at the output signal Sout. Since the time interval Tc is exactly ¼ of a period of each input signal, the limitation of the glitch-free window puts a hard constrain on the design of frequency dividers, particularly to the high-speed frequency dividers with very tiny glitch-free windows. Therefore, the phase selection circuit 1100 must be carefully designed to perform the switching accurately; in other words, the delay time and slew rate of each building block in the signal transmission path must be carefully considered to achieve a glitch-free performance, or else the jitter resulted from the transition will deteriorate the system performance. FIG. 3 is another exemplary timing diagram of partial signals within the frequency divider 1000. Compared with the timing diagram shown in FIG. 2, the phase selection circuit 1100 chooses to compose the frequency-divided output signal Sout with a duty cycle of 60% instead of 40%, and the exact switching timing should also be limited to a time interval Tc' of a same length as the time interval Tc, i.e., ¼ period of the input signal.

SUMMARY OF THE INVENTION

It is therefore one of the objectives of the present invention to utilize retimed control signals to provide a high-speed frequency divider.

According to a first embodiment of the present invention, a frequency divider is provided. The frequency divider includes a phase selection circuit, control circuit and a retiming circuit. The phase selection circuit is arranged to receive a plurality of input signals with different phases, and generate an output signal by selectively outputting one of the input signals according to a plurality of retimed signals. The control circuit is arranged to receive the output signal to generate a plurality of control signals. The retiming circuit is arranged to retime the control signals to generate the retimed signals according to the input signals.

According to a second embodiment of the present invention, a frequency dividing method is disclosed. The frequency dividing method includes: receiving a plurality of input signals with different phases; generating an output signal by selectively outputting one of the input signals according to a plurality of retimed signals; generating a plurality of control signals; retiming the control signals to generate the retimed signals according to the input signals.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
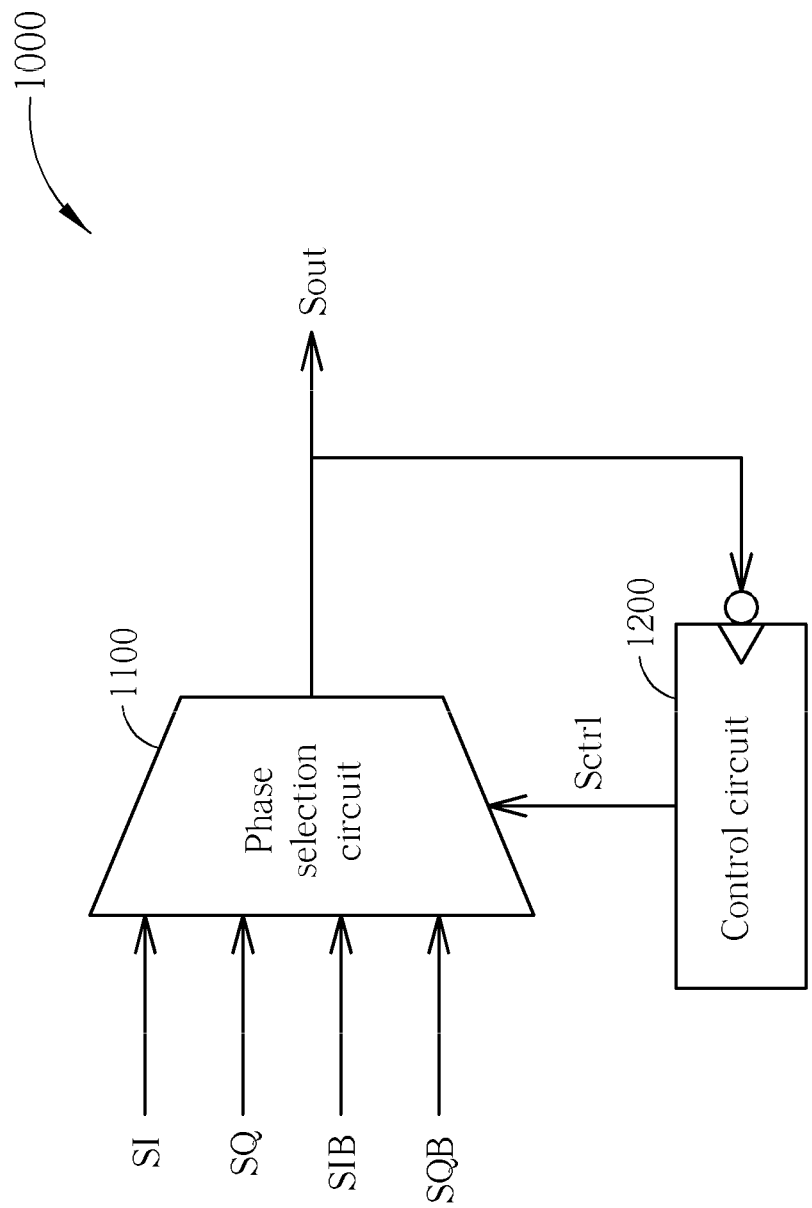
FIG. 1 is a diagram of a conventional phase selection frequency divider.
Figure 2:
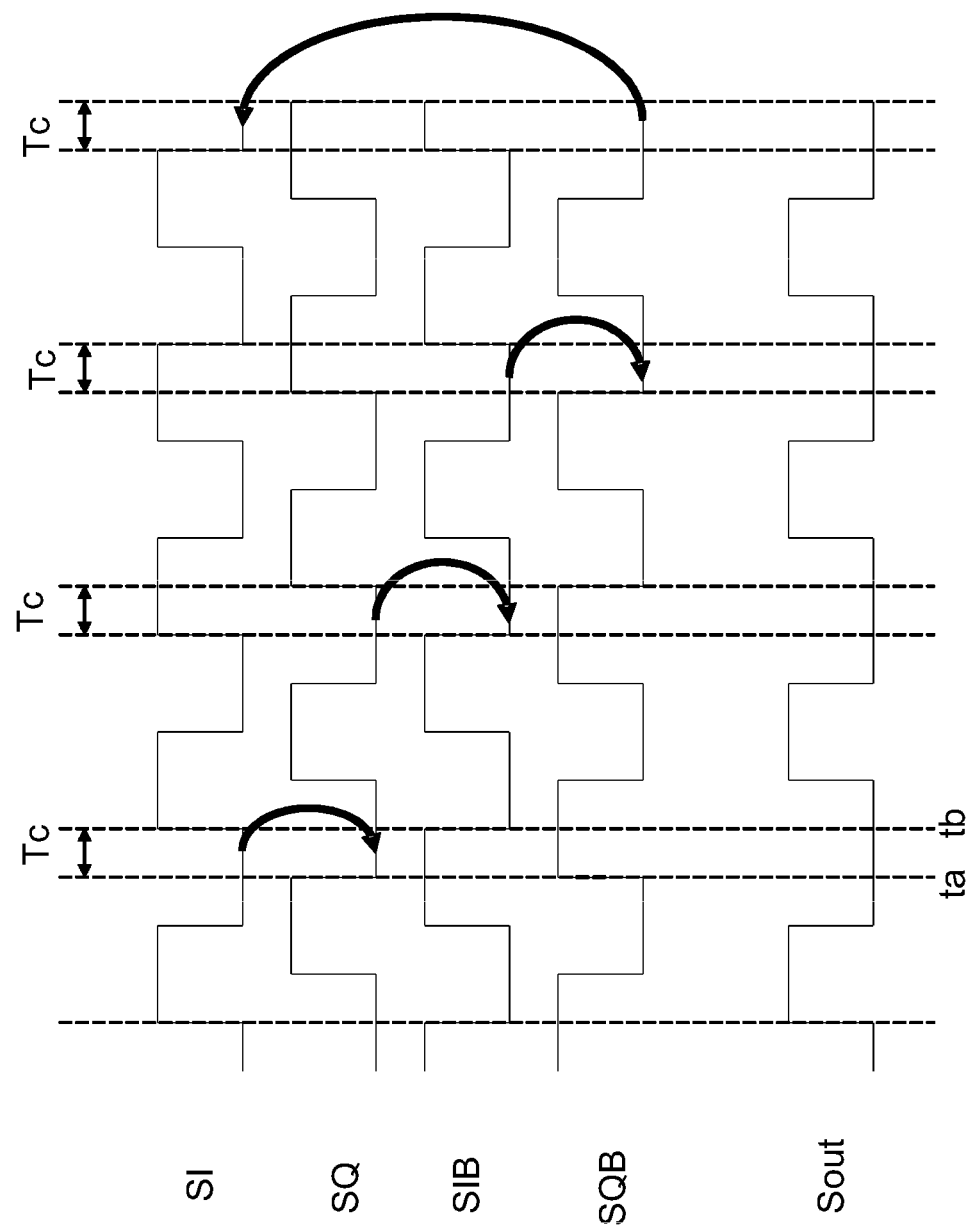
FIG. 2 is an exemplary timing diagram of partial signals within the frequency divider 1000 in FIG. 1.
Figure 3:
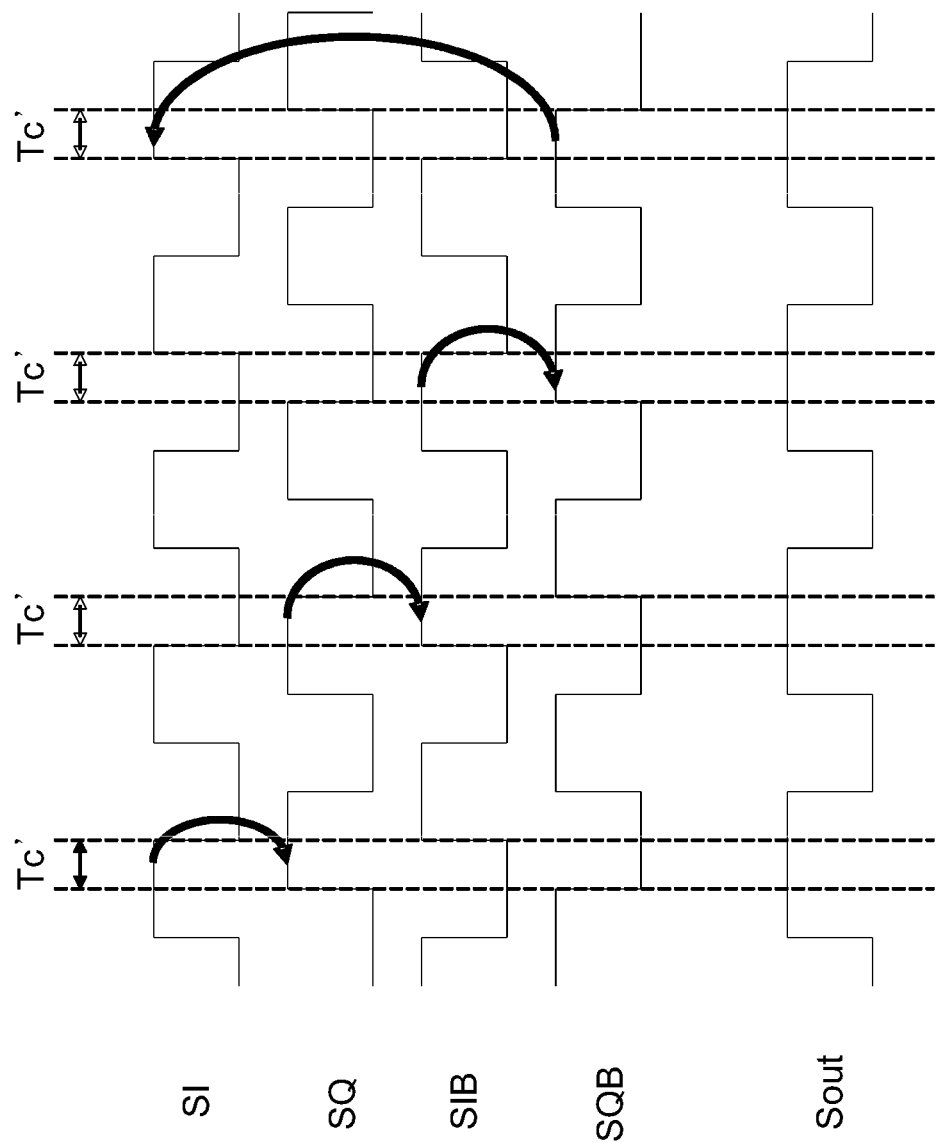
FIG. 3 is another exemplary timing diagram of partial signals within the frequency divider in FIG. 1.
Figure 4:
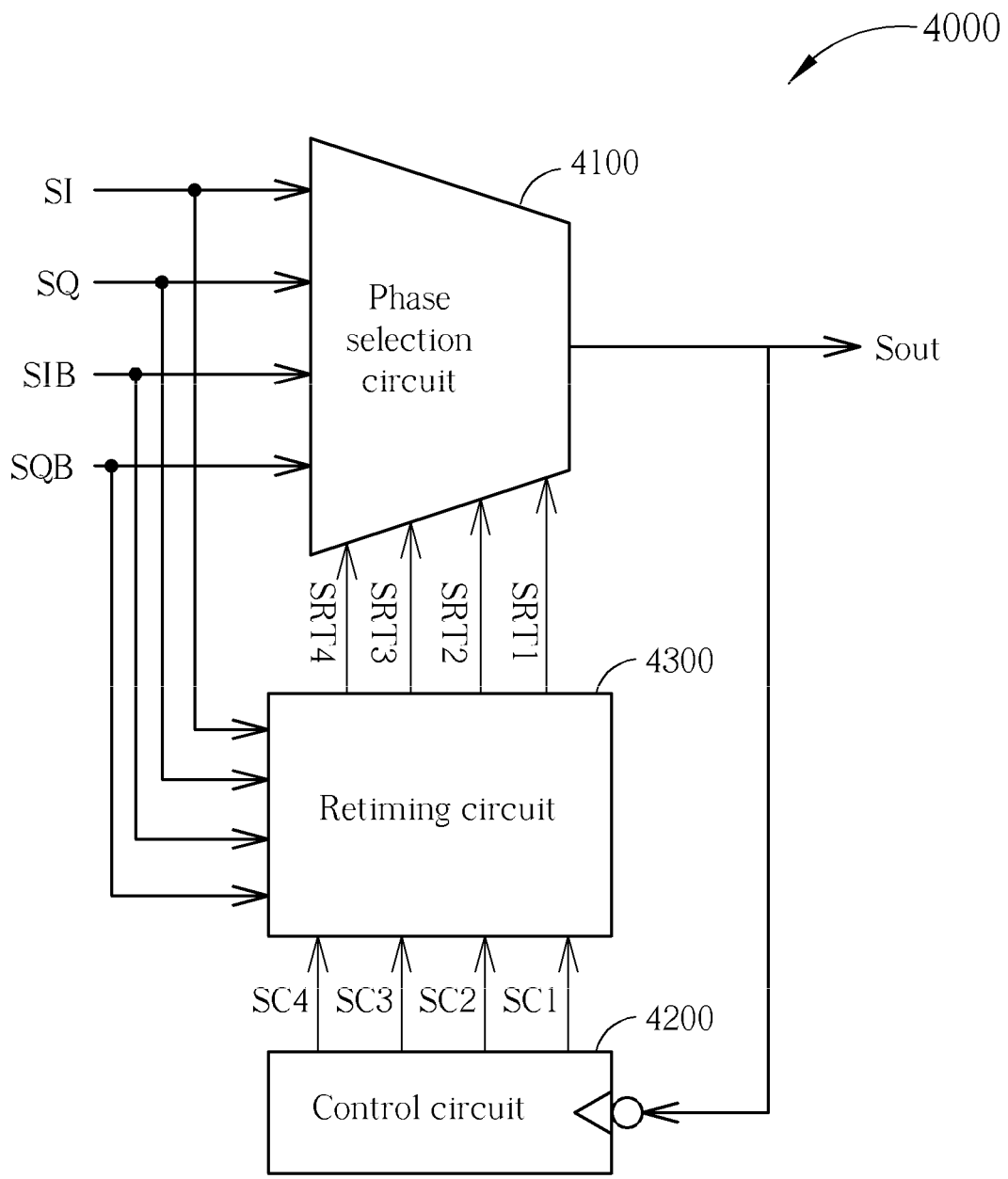
FIG. 4 is an exemplary diagram of a frequency divider according to an embodiment of the present invention.
Figure 5:
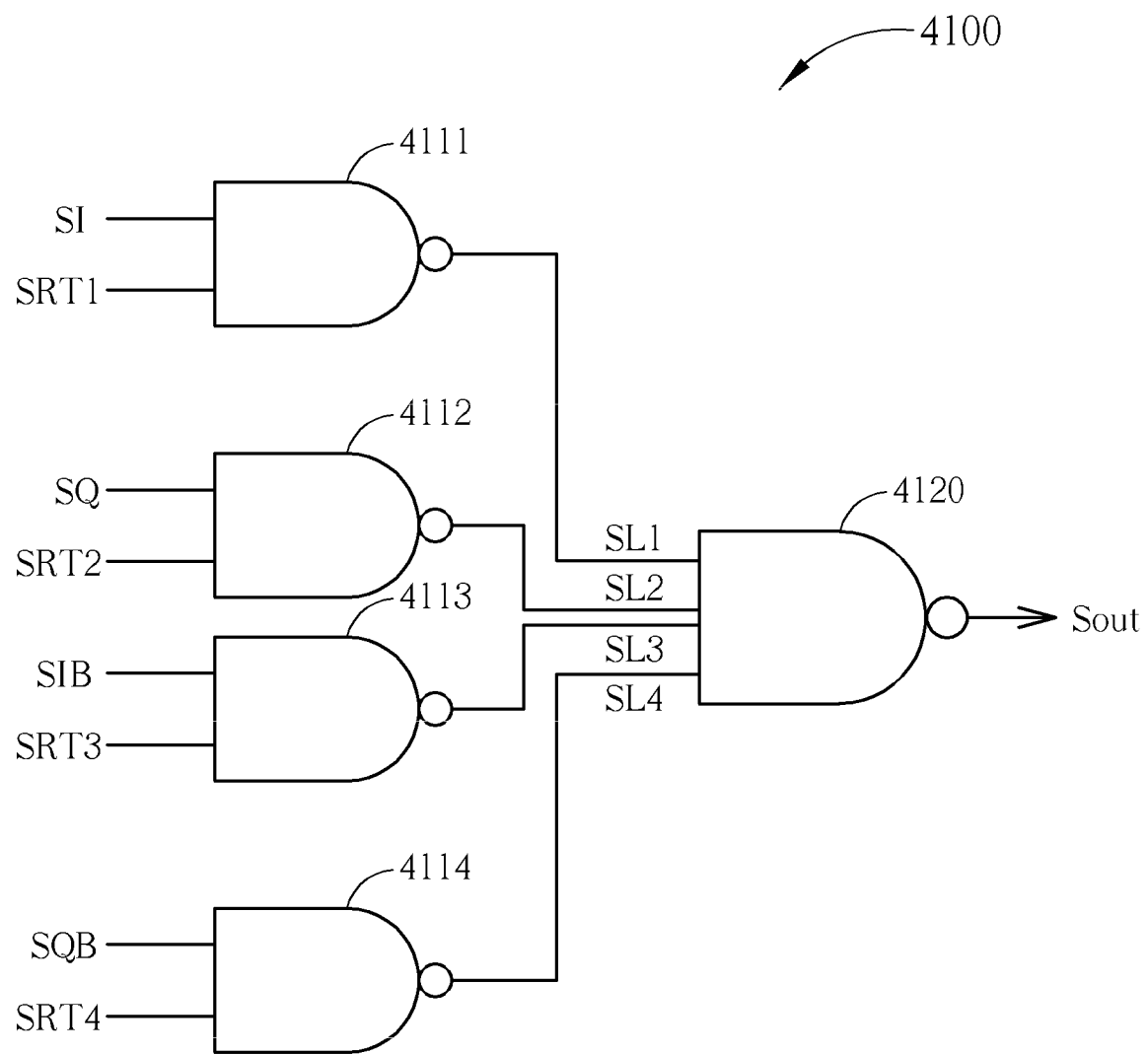
FIG. 5 is an exemplary diagram of a phase selection circuit according to an embodiment of the present invention.

Please refer to FIG. 4, which is an exemplary diagram of a frequency divider 4000 according to an embodiment of the present invention. The frequency divider 4000 includes a phase selection circuit 4100, a control circuit 4200 and a retiming circuit 4300. The phase selection circuit 4100 receives a plurality of input signals with different phases, for example, quadrature signals with equally split phases (e.g., the input signals SI, SQ, SIB, SQB shown in FIG. 4), and to generate a divided-by-1.25 output signal Sout by selectively outputting one of the input signals SI, SQ, SIB, SQB according to retimed signals SRT1-SRT4. The control circuit 4200 receives the output signal Sout to generate control signals SC1-SC4, wherein a period interval of the output signal Sout is composed of partial intervals selected from each of the input signals SI, SQ, SIB, SQB, that is, each period of the output signal is synthesized from partial interval of each input signal. The retiming circuit 4300 retimes the control signals SC1-SC4 to generate the retimed signals SRT1-SRT4 according to the input signals SI, SQ, SIB, SQB. The phase selection circuit 4100 can be implemented by a multiplexer, for example, please refer to FIG. 5, which is an exemplary diagram of the phase selection circuit 4100 according to an embodiment of the present invention, the phase selection circuit 4100 is composed of a plurality of NAND gates, NAND gates 4111-4114 are arranged to receive corresponding input signals SI, SQ, SIB, SQB and corresponding retimed signal SRT1, SRT2, SRT3, SRT4 to generate logic signal SL1-SL4, respectively. A selection NAND gate is for receiving the logic signals SL1-SL4 generated from the NAND gates 4111-4114 and generating the output signal Sout accordingly. The phase selection circuit 4100 in FIG. 5 operates as a multiplexer, when the retimed signal SRT1 is indicative of a logic high level and each of the retimed signals SRT2-SRT4 is indicative of a logic low level, the phase selection circuit 4100 will select the input signal SI as the output signal Sout.

Please note that the frequency divider 4000 in FIG. 4 is for illustrative purpose only, the number of the input signals is not limited to four and the dividing ratio of the frequency divider 4000 is also not limited to 1.25. As long as a frequency divider utilizing retimed control signals to perform phase selection for input signal of identical frequency but different phases, it also falls within the scope of the present invention.

Figure 6:
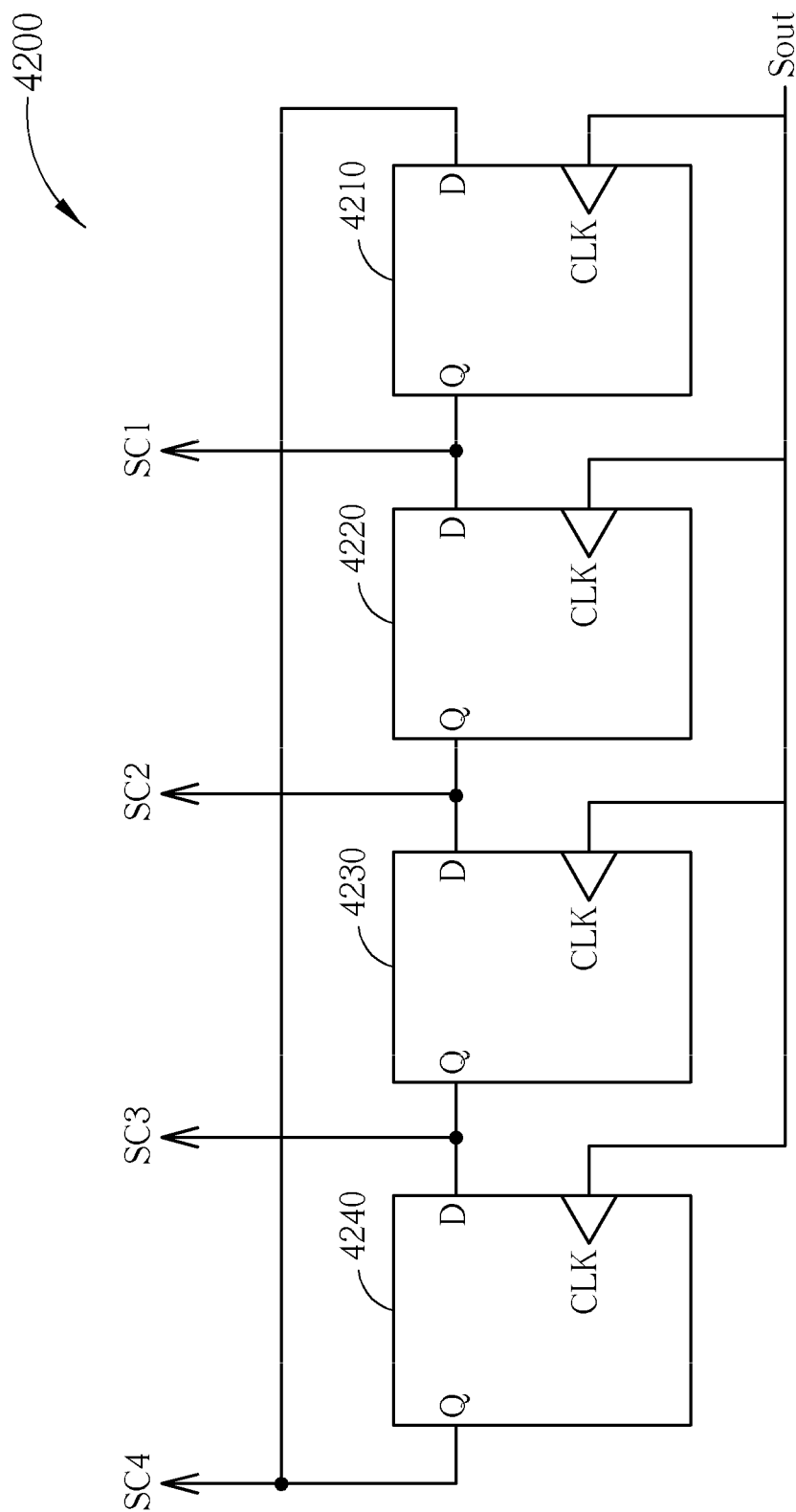
FIG. 6 is an exemplary diagram of a control circuit according to an embodiment of the present invention.

The control circuit 4200 in this embodiment is realized by a shift counter, which is simple and suitable topology for the design purpose of the present invention. Please refer to FIG. 6 for details of the control circuit 4200, FIG. 6 is an exemplary diagram of the structure of the control circuit 4200 according to an embodiment of the present invention, the control circuit 4200 includes four DFFs 4210-4240 arranged in series to form a shift counter, and each of the DFFs 4210-4240 has an clock terminal CLK for receiving the output signal Sout such that each DFF is operated according to a frequency of the output signal Sout, a data terminal D arranged to receive a signal from a preceding DFF, so as to output a corresponding control signal at an output terminal Q. For example, the DFF 4210 receive the control signal SC4 to output the control signal SC1 accordingly, and then the following DFF 4220 receives the control signal SC1 to generate the control signal SC2 and so on. Since the shift counter, i.e., the control circuit 4200, toggles every four period intervals of the output signal Sout, each of the control signals SC1-SC4 has a frequency one-fourth of the output signal Sout.

Figure 7:
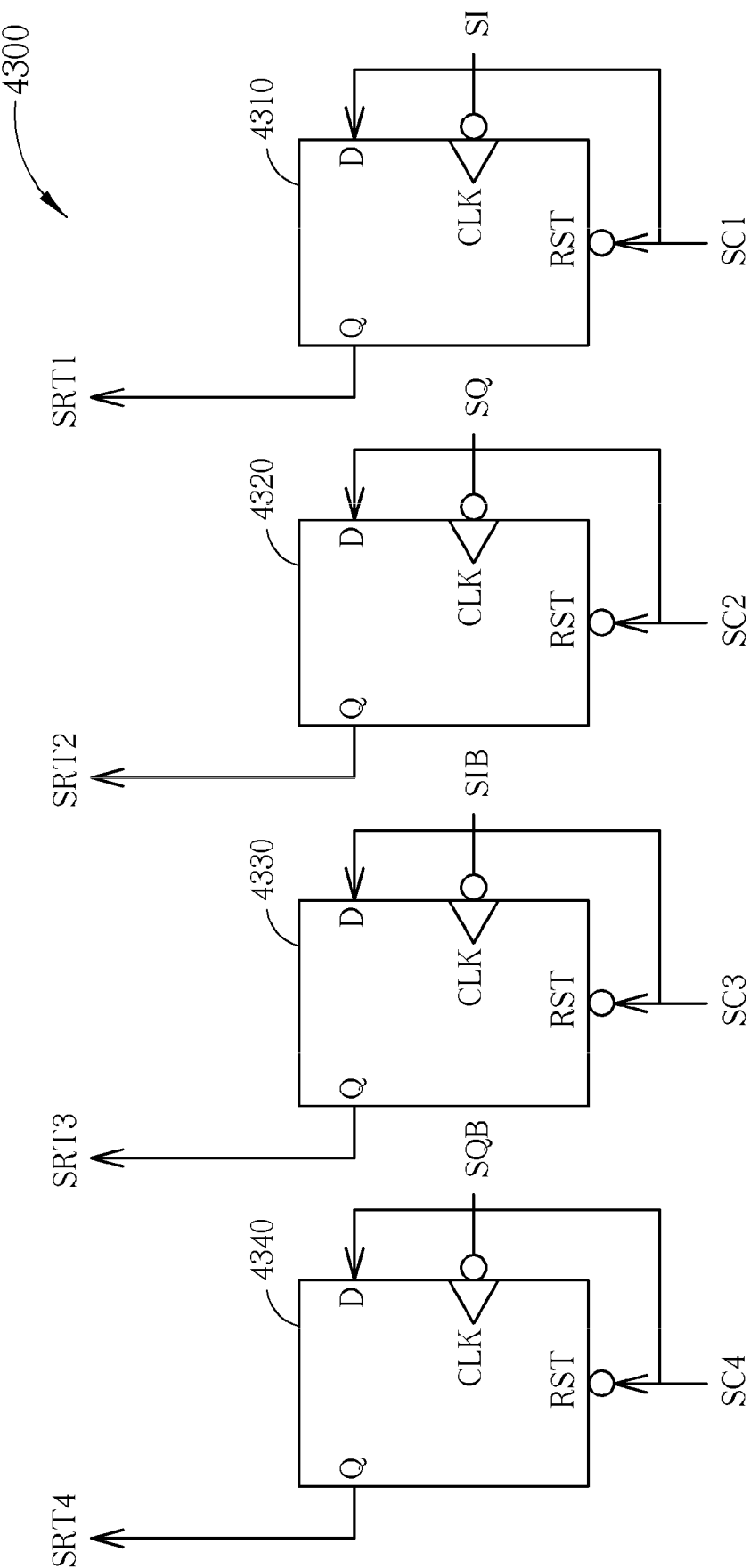
FIG. 7 is an exemplary diagram of a retiming circuit according to an embodiment of the present invention.

Please refer to FIG. 7 for details of the operation and structure of the retiming circuit 4300. FIG. 7 is an exemplary diagram of the retiming circuit 4300 according to an embodiment of the present invention. The retiming circuit 4300 includes four DFFs 4310-4340. The DFFs 4310-4340 have inversed clock terminals CLK for receiving input signal SI, SQ, SIB and SQB, respectively, such that the DFFs 4310-4340 toggle according to a frequency of the input signal SI, SQ, SIB and SQB, respectively. Data terminals D of the DFF 4310-4340 are arranged to receive the control signals SC1-SC4 from the control circuit 4200 to output the retimed signals SRT1-SRT4 at corresponding output terminals Q, respectively. Please note that, the retiming circuit 4300 retimes one of the control signals SC1-SC4 by a trailing edge of a first input signal behind a second input signal in phase domain after the phase selection circuit 4100 generates the output signal Sout by selecting the second input signal. For example, in this embodiment, the DFF 4320 receives the input signal SQ at the inversed clock terminal CLK, receives the control signal SC2 at the data terminal D, and retimes the control signal SC2 according to the clock terminal CLK. Please note that in this exemplary embodiment, the input signal SQ is fed into the DFF 4320 at the inversed clock terminal CLK, the DFF 4320 toggles according falling edges of the input signal SQ. To be more specific, the DFF 4310 of the retiming circuit 4300 retimes the control signal SC2, which is for controlling the phase selection circuit 4100 to select the input signal SQ as the output signal Sout, according to the falling edges of the input signal SQ; in addition, each one of the DFFs 4310-4340 is reset by a trailing edge of a specific input signal after the phase selection circuit generates the output signal Sout by selecting the specific input signal. For example, after the phase selection circuit 4100 generates the output signal Sout by selecting the input signal SQ according to a rising edge of the retimed signal SRT2, the DFF 4320, which is for outputting the retimed signal SRT2 to control the selection of the input signal SQ, is thereby reset by a falling edge of the input signal SQ. In this way, the switching operation of selection will only occur after the input signal SQ is indicative of an identical voltage level as the input signal SI, and therefore a smooth phase selection operation can be ensured.

In general, the retiming circuit 4300 retimes a control signal (for example, the control signal SC2) by a trailing edge of a lagging input signal (for example, the falling edge of the input signal SQ) behind a leading input signal (for example, the input signal SI) in phase domain after the phase selection circuit 4100 generates the output signal SI by selecting the leading input signal (e.g., the input signal SI). In the other embodiments, the retiming circuit 4300 can also perform retiming operation according to rising edges of the lagging input signal according to different design consideration, as long as the control signals for selecting different input signal are self-aligned in accordance with corresponding input signals, these kinds of design all falls within the scope of the present invention.

Figure 8:
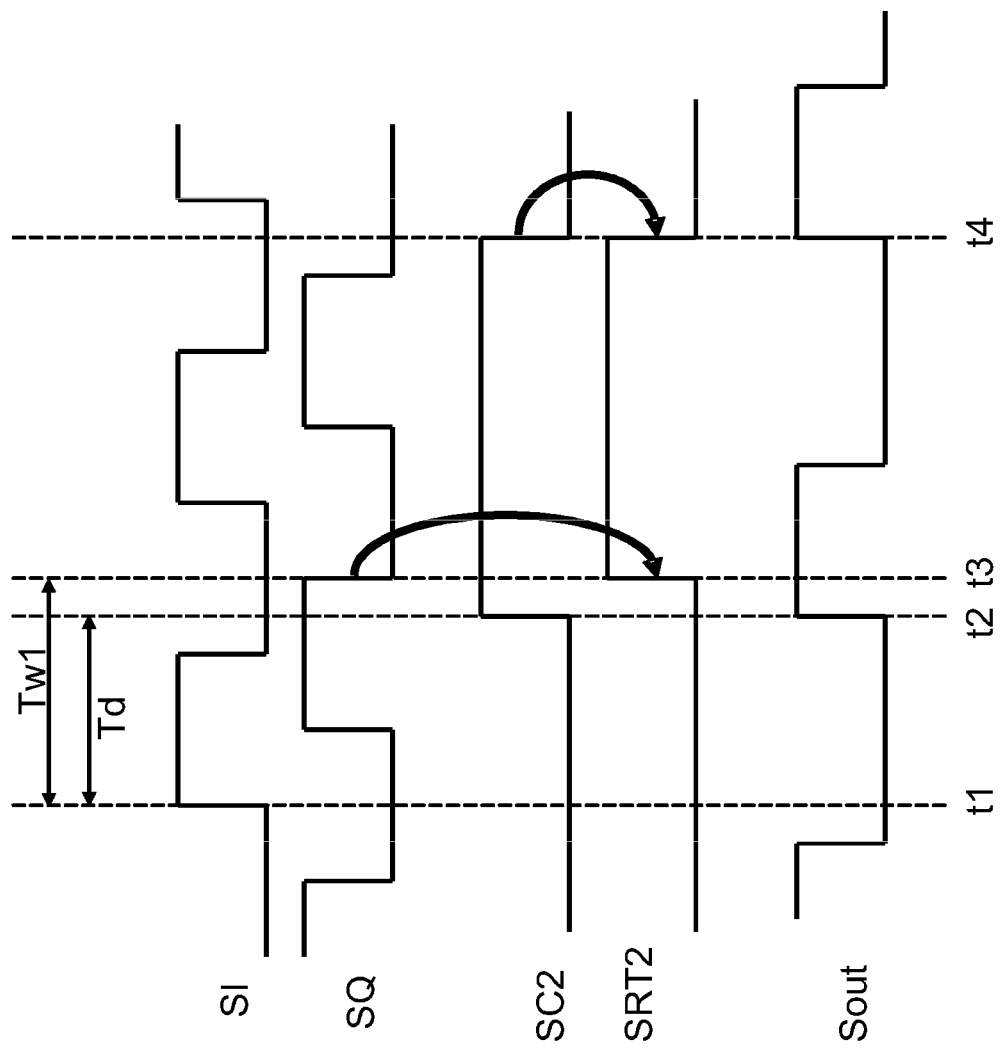
FIG. 8 is a timing diagram illustrating partial signals in a frequency divider when a frequency divider switches from an input signal to another input signal according to an embodiment of the present invention.

Please refer to FIG. 8 for operation details of the retiming circuit 4300, FIG. 8 is a timing diagram illustrating partial signals in the frequency divider 4000 when the frequency divider 4000 switches from the input signal SI to the input signal SQ according to an embodiment of the present invention. Although the rising edge of the input signal SI occurs at a time point t1, a corresponding rising edge of the output signal Sout appears at a following time point t2 due to inherent gate delay, it takes a time interval Td (Td=t2–t1) for the phase selection circuit 4100 to output the output signal Sout according to the input signal SI. As shown in FIG. 8, the control signal SC2 rises at a time point t2 in accordance with the output signal Sout, please note that at the time point t2, the input signals SI and SQ are indicative of different voltage levels and switching from the input signal SI to the input signal SQ will no doubt cause glitches in the output signal Sout, however, in this embodiment, the DFF 4320 in the retiming circuit 4300 will latch the control signal SC2 until the input signal SQ is indicative of a same voltage level as the input signal SI (i.e., at a time point t3), and then output the retimed signal SRT2 for the phase selection circuit 4100 to perform phase selection. In addition, the retimed signal SRT2 is further reset at a time point t4 by the falling edge of the control signal SC2 to prevent from interfering the other retimed signals. Please note that the glitch-free window of the frequency divider 4000 is a length of the time interval Tw1, which is ¾ of a period of each input signal, in other words, the present invention is able to relax the constrain on the glitch-free window such that an operation frequency of the frequency divider 4000 can be pushed much higher than the traditional phase selection frequency dividers.

Figure 9:
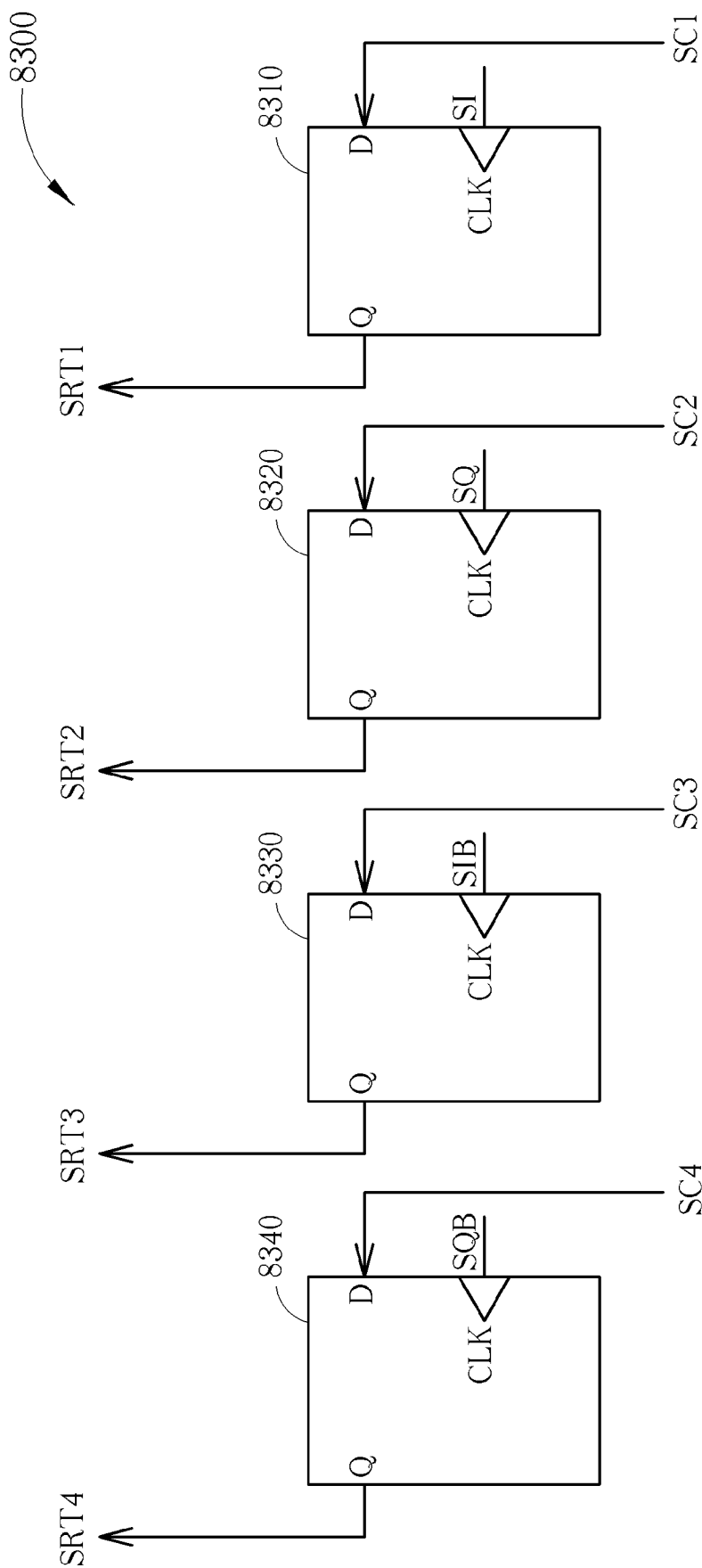
FIG. 9 is an exemplary diagram of a retiming circuit according to another embodiment of the present invention.

The retiming circuit 4300 in FIG. 7 utilizes DFFs 4310-4340 to perform self-alignment for the control signals SC1-SC4 according to the input signals SI, SQ, SIB and SQB, respectively. However, this is not supposed to be a limitation to the present invention. Please refer to FIG. 9, which is an exemplary diagram of a retiming circuit 8300 according to another embodiment of the present invention. The retiming circuit 8300 includes D latches 8310-8340. The D latches 8310-8340 have clock terminals CLK arranged to receive the input signal SI, SQ, SIB and SQB, respectively, the data terminals D of the D latches 8310-8340 are arranged to receive the control signal SC1-SC4 for the D latches 8310-8340 to output the retimed signals SRT1-SRT4 at output terminals Q, respectively. For each D latch of the D latches 8310-8340, for example, the D latch 8320, when the input signal SQ is indicative of a "latch" operation state (a high voltage level in this embodiment), a value of the retimed signal SRT2 will be hold at the output terminal Q in disregard of the control signal SC2; when the input signal SQ is indicative of a "sense" operation state (a low voltage level in this embodiment), the value of the retimed signal SRT2 will be copied from that of the control signal SC2. Since the sense operation of each D latch occurs when the corresponding input signal is indicative of the "sense" operation, the corresponding retiming signal generated by the D latch will control the phase selection circuit 4100 to perform phase switching from a preceding input signal to the corresponding input signal which is right behind the preceding input signal in phase domain; when the corresponding input signal is indicative of the "latch" operation, the D latch will hold an original retimed signal until the corresponding input signal is toggled. In this way, the phase switching in the phase selection circuit 4100 can be accurately performed between two input signals of an identical voltage level, and henceforth a glitch-free frequency divided signal can be achieved.

Figure 10:
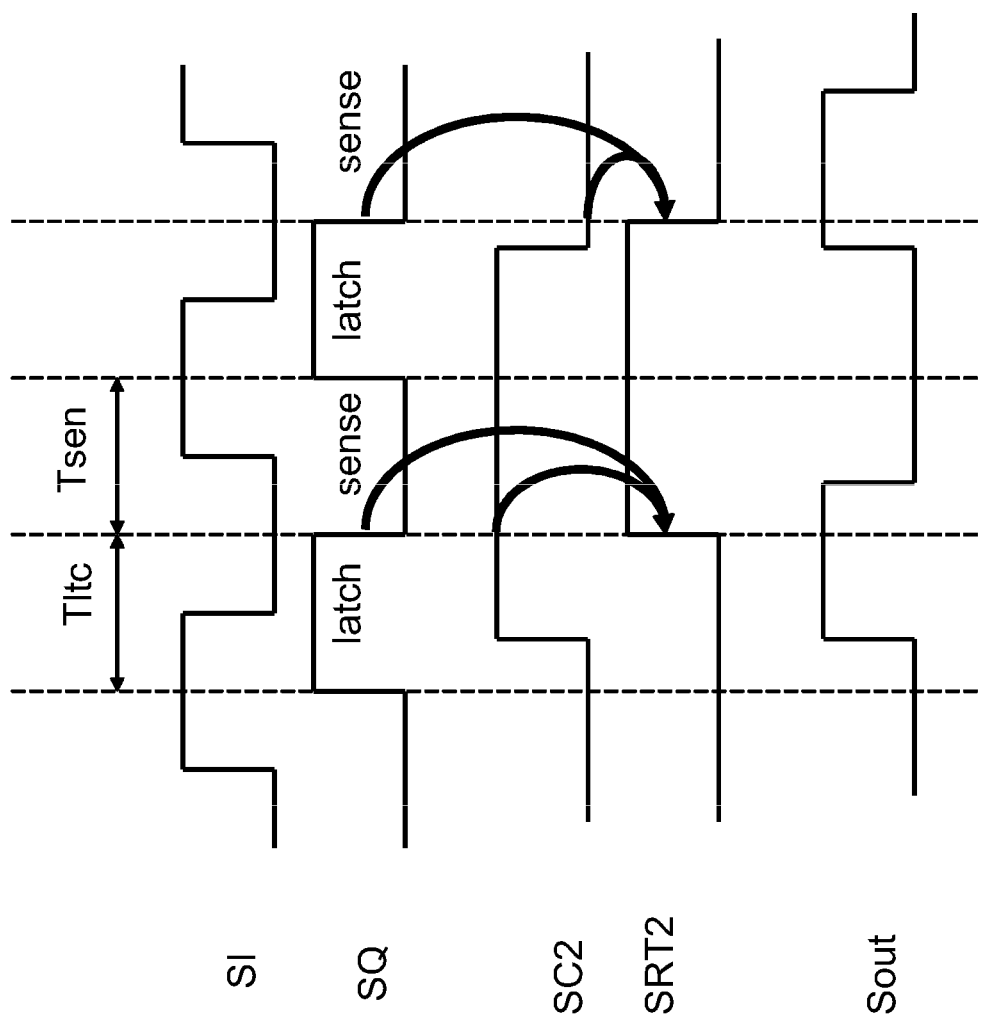
FIG. 10 is a timing diagram illustrating partial signals in a frequency divider when a frequency divider switches from an input signal to another input signal according to another embodiment of the present invention.
Figure 11:
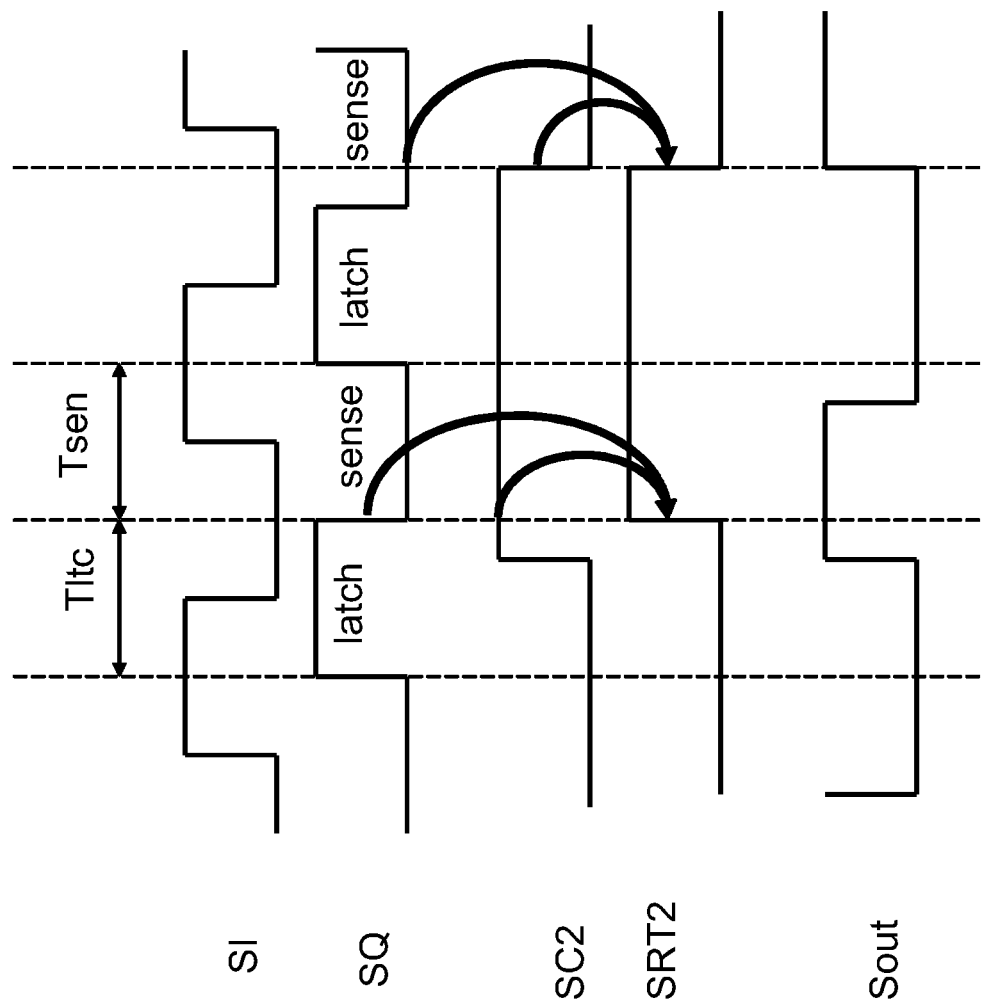
FIG. 11 is a timing diagram illustrating partial signals in a frequency divider when a frequency divider switches from an input signal to another input signal according to yet another embodiment of the present invention.

Please refer to FIG. 10 and FIG. 11 for operation details of the retiming circuit 8300. FIG. 10 is a timing diagram illustrating partial signals in a frequency divider utilizing the retiming circuit 8300 when the frequency divider switches from the input signal SI to the input signal SQ according to another embodiment of the present invention. In FIG. 10, the input signal SI is selected to produce the output signal Sout after a longer time delay (around ⅜ period of the input signal SI), and the control signal SC2 rises as the output signal Sout immediately, however, since the next input signal SQ behind the input SI is indicative of the "latch" operation state (i.e., the input signal SQ is at the high voltage level with a time interval Tltc), the retiming circuit 4300 will hold the retimed signal SRT2 at a previous voltage level (e.g., a low voltage level in this embodiment), and when the input signal SQ changes to be indicative of the "sense" operation state (i.e., the input signal SQ is at the low voltage level with a time interval Tsen), the retiming circuit 4300 will sense the control signal SC2 and pull the retimed signal SRT2 to a high voltage level for the phase selection circuit 4100 to perform phase switching from the input signal SI to the input signal SQ. When the control signal SQ falls down to the low voltage level, the retimed signal SRT2 will still be kept at the high voltage level since the input signal SQ is indicative of the "latch" operation state; when the input signal SQ also falls to be indicative of the "sense" operation state, the retiming circuit 4300 will thereby sense the control signal SC2 and pull the retimed signal SRT2 down to the low voltage level. In this way, the retimed signal SRT2 is toggled only when the input signals SI and SQ are of an identical voltage level.

FIG. 11 is a timing diagram illustrating partial signals in a frequency divider utilizing the retiming circuit 8300 when the frequency divider switches from the input signal SI to the input signal SQ according to yet another embodiment of the present invention. In FIG. 11, the input signal SI is selected to produce the output signal Sout after a longer time delay (around ⅝ period of the input signal SI) than in FIG. 10, the retiming circuit 4300 will hold the retimed signal SRT2 at the low voltage level until the input signal SQ changes to be indicative of the "sense" operation state, and when the control signal SQ falls down to the low voltage level, the retimed signal SRT2 is also pulled down simultaneously by the retiming circuit 4300 to prevent from interfering the other retimed signals. It can be seen from FIG. 10 and FIG. 11 that since each D latch is triggered by a corresponding input signal to generate a corresponding retimed signal for switching from a previous input signal to the corresponding input signal, this self-alignment operation will improve phase selection in the phase selection circuit 4100 with an improved glitch-free window.

To summarize, the embodiments of the present invention provides retime control signals to perform phase selection in a frequency divider with fractional division and glitch-free operation. The retime signals can be generated by a retiming circuit composed of merely a few DFFs or D latches such that a compact and high-speed frequency divider can be achieved.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A frequency divider, comprising:
   a phase selection circuit, arranged to receive a plurality of input signals with different phases, and to generate an output signal by selectively outputting one of the input signals according to a plurality of retimed signals;
   a control circuit, arranged to receive the output signal to generate a plurality of control signals; and
   a retiming circuit, arranged to retime the control signals to generate the retimed signals according to the input signals;
   wherein the retiming circuit comprises a plurality of D latches, arranged to retime the control signals, respectively, wherein each of the D latches has an clock terminal arranged to receive a clock signal referenced from a corresponding input signal, a data terminal arranged to receive a data input referenced from a corresponding control signal, so as to output a corresponding retimed signal at an output terminal according to the clock input and the data input, and each of the D latches senses the data input referenced from the corresponding control signal for a first time interval to generate the retimed signal according to the data input when the clock signal referenced from the corresponding input signal is a first voltage level; and the D latch holds the retimed signal for a second time interval when the clock signal referenced from the corresponding input signal changes to a second voltage level different from the first voltage level.

2. The frequency divider of claim 1, wherein a period interval of the output signal is composed of partial intervals selected from each of the input signals.

3. The frequency divider of claim 1, wherein the retiming circuit is configured to perform a self-alignment for the control signals according to the input signals.

4. The frequency divider of claim 1, wherein the control circuit is a shift counter.

5. The frequency divider of claim 1, wherein the phase selection circuit is a multiplexer configured to selectively output one of the input signals as the output signal.

6. The frequency divider of claim 5, wherein each period of the output signal is synthesized from partial interval of selected ones of the input signals.

7. The frequency divider of claim 1, wherein the phase selection circuit comprises:
   a plurality of NAND gates, each arranged to receive a specific input signal and a specific retimed signal to generate a specific logic signal; and
   a selection NAND gate, coupled to the NAND gates, the selection NAND gate arranged to receive a plurality of logic signals generated from the NAND gates and generate the output signal.

8. The frequency divider of claim 1, wherein the control circuit comprises:
   a plurality of D flip-flops (DFFs), each of the DFFs has a clock terminal arranged to receive the output signal, an output terminal arranged to output one of the plurality of control signals, and a data terminal arranged to directly connect to the output terminal of a preceding DFF.

9. A frequency dividing method, comprising:
   receiving a plurality of input signals with different phases;
   generating an output signal by selectively outputting one of the input signals according to a plurality of retimed signals;
   generating a plurality of control signals; and
   retiming the control signals to generate the retimed signals according to the input signals;
   wherein the step of retiming the control signals to generate the retimed signals according to the input signals comprises:
   providing a plurality of D latches to retime the control signals, respectively, wherein each of the D latches has an clock terminal arranged to receive a clock signal referenced from a corresponding input signal, a data terminal arranged to receive a data input referenced from a corresponding control signal, so as to output a corresponding retimed signal according to the clock input and the data input, and each of the D latches senses the data input referenced from the corresponding control signal for a first time interval to generate the retimed signal according to the data input when the clock signal referenced from the corresponding input signal is a first voltage level; and the D latch holds the retimed signal for a second time interval when the clock signal referenced from the corresponding input signal changes to a second voltage level different from the first voltage level.

10. The frequency dividing method of claim 9, wherein a period interval of the output signal is composed of partial intervals selected from the input signals.

11. The frequency dividing method of claim 9, wherein the step of retiming the control signals to generate the retimed signals according to the input signals comprises:
    performing a self-alignment for the control signals according to the input signals.

12. The frequency dividing method of claim 9, wherein the step of generating the plurality of control signals comprises:
    providing a plurality of D flip-flops (DFFs), wherein each of the DFFs has a clock terminal arranged to receive the output signal, an output terminal arranged to output one of the plurality of control signals, and a data terminal arranged to directly connect to the output terminal of a preceding DFF.

* * * * *